(12) United States Patent
Myers et al.

(10) Patent No.: US 7,498,376 B2
(45) Date of Patent: Mar. 3, 2009

(54) THERMAL TRANSIENT SUPPRESSION MATERIAL AND METHOD OF PRODUCTION

(75) Inventors: Bruce A. Myers, Kokomo, IN (US); Arun K. Chaudhuri, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 641 days.

(21) Appl. No.: 10/874,654

(22) Filed: Jun. 23, 2004

(65) Prior Publication Data

US 2005/0287352 A1    Dec. 29, 2005

(51) Int. Cl.
*C08K 5/01*    (2006.01)

(52) U.S. Cl. ........................ 524/487; 524/275; 524/277; 524/488; 524/489

(58) Field of Classification Search ................. 524/275, 524/277, 487, 488, 489
See application file for complete search history.

(56) References Cited

U.S. PATENT DOCUMENTS

| | | | |
|---|---|---|---|
| 4,551,499 A * | 11/1985 | Cranfield et al. ............ 524/487 |
| 5,007,478 A | 4/1991 | Sengupta |
| 5,060,114 A | 10/1991 | Feinberg et al. |
| 5,189,102 A * | 2/1993 | Tsubuko et al. ............ 525/112 |
| 5,212,218 A * | 5/1993 | Rinehart .................... 523/455 |
| 5,224,356 A | 7/1993 | Colvin et al. |
| 5,288,769 A | 2/1994 | Papageorge et al. |
| 5,366,801 A | 11/1994 | Bryant et al. |
| 5,709,945 A | 1/1998 | Lee et al. |
| 5,785,913 A | 7/1998 | Clark et al. |
| 5,851,338 A | 12/1998 | Pushaw |
| 6,065,612 A | 5/2000 | Rinderer |
| 6,485,595 B1 | 11/2002 | Yenni et al. |
| 6,703,128 B2 | 3/2004 | Myers et al. |
| 2003/0027910 A1 | 2/2003 | Misra et al. |
| 2003/0077478 A1 | 4/2003 | Dani et al. |
| 2003/0158294 A1 | 8/2003 | Chaudhuri et al. |

FOREIGN PATENT DOCUMENTS

WO    02/083440    10/2002

OTHER PUBLICATIONS

Wolfmeier et al, "Waxes", Wiley Interscience, Online Publication, Jun. 15, 2000.*

* cited by examiner

*Primary Examiner*—Edward J Cain
(74) *Attorney, Agent, or Firm*—Jimmy L. Funke

(57) ABSTRACT

The present invention provides a high performance polymer-base material capable of dissipating transient thermal energy generated by an electronic module, such as a heat-generating power device. The methods of the present invention involve adding a suitable thinner to reduce the viscosity and increase the volume of a polymer-base matrix material so that a large amount of thermal absorbing particles may be added. The final cured product may have a filler content of more than 80 weight %. Further, the present invention provides a new and reduced cost formulation of a polymer-base thermal transient suppression material containing organic wax particles.

12 Claims, 3 Drawing Sheets

THERMAL TRANSIENT SUPPRESSION MATERIAL AND METHOD OF PRODUCTION

TECHNICAL BACKGROUND

1. Field of the Invention

The present invention relates to methods and systems for managing/dissipating heat generated by electronic devices. More particularly, this invention relates to materials that absorb heat generated by transient thermal events.

2. Description of the Related Art

Heat generated by electronic devices during normal operation can cause overheating and device failure if not conducted away. While steady-state heat must be removed from the device and dissipated to the surrounding environment to prevent overheating, transient energy can be absorbed by the device and any surrounding packaging material and then dissipated to the environment more slowly. An example of a packaging material is a potting compound used to seal and protect a circuit device mounted on a circuit board within an open or closed case. Transient thermal energy can be absorbed with the use of packaging materials by two mechanisms. The first and most commonly used is the energy absorbed by the packaging material due to its inherent specific heat. The second and less commonly used mechanism is to absorb thermal energy by using the latent heat of the packaging material as the material undergoes a phase change. The most common phase change materials are of three types: solid-to-liquid, liquid-to-gas, and solid-to-solid phase change. Each of these types of phase change materials has disadvantages for electronic applications. Though solid-to-liquid phase change materials are capable of absorbing relatively large amounts of thermal energy, costly sealed containment is required to prevent loss of the material when in the liquid state. Liquid-to-gas phase change materials are capable of absorbing even greater amounts of thermal energy, but the cost of containing the gas phase is typically higher than that for solid-to-liquid materials. Alternatively, the heat dissipation system must allow for replenishing the phase change material. In contrast to the preceding materials, solid-to-solid phase change materials do not require special or complicated containment structures. However, the energy absorption of these materials is considerably less than solid-to-liquid or liquid-to-gas phase change materials. Another shortcoming is that solid-to-solid phase change materials are unable to provide an effective barrier to liquid and ionic contamination when used to encapsulate or pot electronic modules.

It can be appreciated that for a phase change material to be suitable for a wide range of applications in electronic products, the material should not only have relatively high thermal capacitance during the phase change, but should also be relatively low cost and self-containing, i.e., not require any sealing or special containment over the operating temperature range of the device being packaged. Additional desirable properties for electronic applications include a high thermal conductivity to quickly transport heat away from a heat-generating component, and the capability of customizing the temperature at which the phase change occurs. The capability to be used as a potting compound is also desirable for many applications, requiring that the phase change material have a high electrical resistance for direct contact with an electrical circuit and the ability to stop liquid and ionic intrusion. As a potting material, the material should also preferably have low ionic content for corrosion resistance, a low elastic modulus over the intended temperature range in order to minimize stress on the electrical components during thermal cycling, and good adhesion and minimal material property changes after long term exposure to the operating environment. While phase change materials exist that have several or more of these preferred characteristics, it would be desirable if a phase change material existed that exhibited each of the characteristics to the degree necessary to be useful in a wide variety of applications, and particularly as an encapsulation or potting material for an electronic module.

SUMMARY OF THE INVENTION

The present invention provides thermal transient suppression materials (TTSM's) containing thermally absorptive filler particles, and methods for producing the TTSM's.

In one aspect of the invention, the thermal absorption characteristics of a TTSM may be improved by increasing the content of the filler particles. This may be accomplished by mixing a suitable thinner, such as Octamethyl trisiloxane, to the matrix material to reduce its viscosity before or during the addition of the fillers. The viscosity reduction allows more filler particles to be added to the matrix material. During the curing process, the thinner evaporates away, leaving only the matrix material and the fillers in the final product. The filler content of the cured TTSM may increase to about 97 weight % (with a thinner) from a maximum of 80 weight % (without a thinner). The thinner evaporation also reduces the volume of the matrix material, allowing for better particle-to-particle contact of the filler materials. This improves the thermal conductivity of the final material.

In another aspect of the present invention, a low-cost TTSM particularly useful for applications that generate thermal transients that are lower in power and longer in duration is provided. The method involves using a non-metallic organic fillers as a phase change thermal absorption component of the final material. The use of these non-electrically conductive organic materials eliminates the need for the phase change particle coating process, reduces the density of the final material, and reduces constituent material costs. Although the use of non-metallic phase change materials reduces the performance of the final TTSM, the performance of this new TTSM is still suitable for some applications and reduces the cost of the potting material.

Other objects and advantages of this invention will be better appreciated from the following detailed description.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein.

Figure 1:
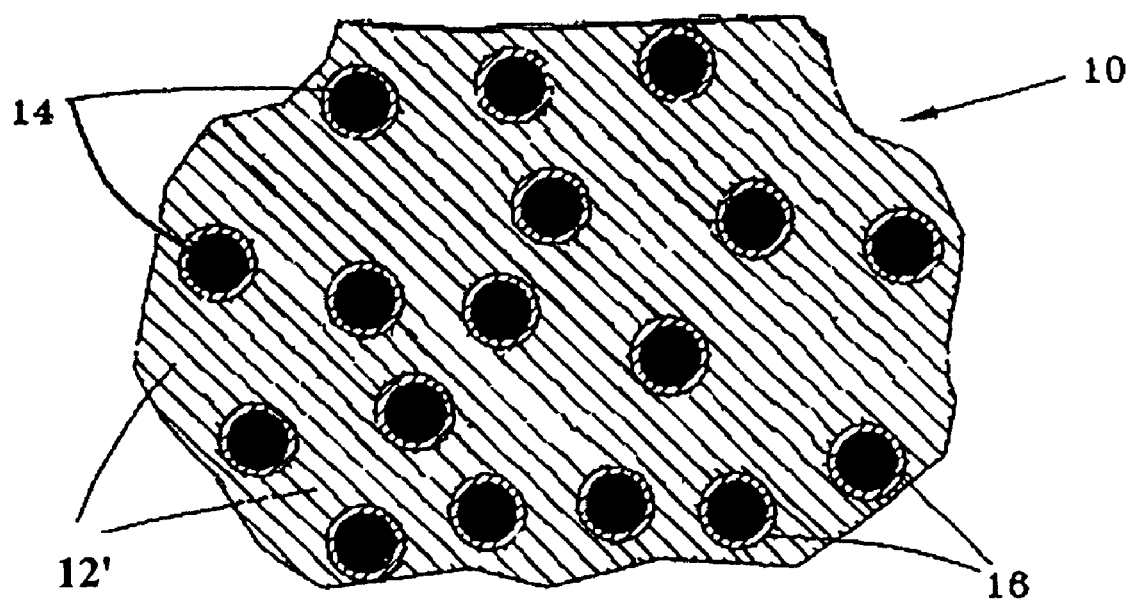
FIG. 1 is a thermal transient suppression material (TTSM) according to one embodiment of the present invention, prior to a curing process.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DETAILED DESCRIPTION OF THE INVENTION

The present methods may be coupled with the methods disclosed in U.S. Pat. No. 6,703,128 and US patent application No. 20030158294, hereby fully incorporated by reference.

FIGS. 1-4 represent embodiments of the TTSM of the present invention. Each embodiment may be used as a potting compound or an encapsulation material to pot or encapsulate a heat-generating power device on a circuit board or an entire electronic module. In FIGS. 1-4, TTSM 10, 20 and 30 are represented as comprising matrix material 12 in which filler particles, such as metal particles 14, dielectric particles 22, and non-metallic particles 25, may be dispersed to promote the thermal properties of TTSM 10, 20 and 30. Because metals are electrically conductive, particles 14 in FIGS. 1-3 may be provided with dielectric coating 16 to ensure that the TTSM is not electrically conductive.

Figure 2:
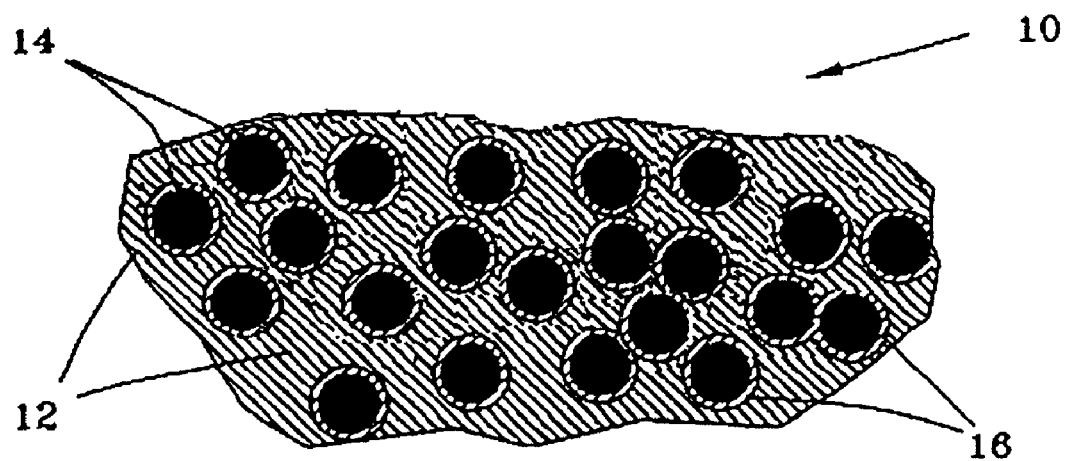
FIG. 2 is a TTSM of FIG. 1, after the curing process.

One way to increase thermal conductivity and thermal absorptivity of a TTSM is to increase the content of the filler particles. In order to produce a TTSM with an increase in the filler content, the matrix material is mixed with a suitable thinner to reduce the viscosity and increase the volume of the matrix material, prior to or during the addition of the filler particles. Because of the reduced viscosity and the larger volume, a large amount of filler particles may be added to the matrix-thinner mixture. FIG. 1 represents TTSM 10 during the production process, and before the curing process, and FIG. 2 represents TTSM 10 after the curing process. In FIG. 1, matrix material 12' has an expanded volume due to the presence of the thinner which is mixed into matrix material 12. The thin (non-viscous) matrix material 12' has a capacity to accept a larger amount of filler particles 14 than the matrix material without the thinner. Up to about 70-80 weight % of the thinner may be added to the matrix material and still allow TTSM 10 to cure and stiffen properly. The curing process may be accomplished by any traditional means such as heat and/or UV exposure. In FIG. 2, cured TTSM 10 has matrix material 12 which has a reduction in the volume and/or the thickness compared to FIG. 1, allowing for better particle-to-particle contact of the filler particles. This close contact improves the thermal conductivity of the final material. The cured TTSM 10 may have a filler content that reach about 97 weight % of the cured product. If the thinner is not used in the mixing process, only up to about 80 weight % of the filler content may be reached.

Suitable materials for use as the matrix material in the TTSM of the present invention include epoxies, silicones and polyurethanes. The matrix material may be gel materials, particularly silicone gels that have advantageous properties such as their ability for self-containment (as a result of being a gel), the ability to stop liquid and ionic intrusion, high electrical resistance, low ionic content for corrosion resistance, low elastic modulus, and minimal material property changes after long exposures to high temperatures. A particularly suitable silicone gel is available from Dow Corning under the name TOUGH GEL-4207.RTM., which is generally a mixture of dimethyl siloxane, dimethyl siloxane-dimethyl vinyl terminated, dimethyl siloxane-hydrogen terminated, trimethylate silica, and dimethyl solxane. Tough Gel is particularly suitable as having a viscosity reduced to about 16 centipoise by a suitable thinner to receive the filler particles. The thin Tough Gel filler particle mixture may be initially applied as a slightly viscous liquid, then cures to a soft gel solid.

Any suitable thinner that is effective in reducing the viscosity of the matrix material may be used in the method of the present invention. The suitable thinner should also allow proper curing. Any chemical that is miscible with silicone in all proportion and has low viscosity should be suitable. A thinner with viscosity of about 1 centipoise is particularly suitable. The thinner should also have a boiling point that allows the thinner to escape the matrix by the time the processing is done. A suitable thinner for the above matrix material includes pure or substantially pure Octamethyl trisiloxane, tetradecamethyl hexasiloxane, or hexamethyl disiloxane. Examples of commercial Octamethyl trisiloxane products that may be used include Dow Corning OS-20, Dow Corning 200 (R) Fluid 1 CST, Shinetsu DMF 1, and Shenetsu D993.RTM Octamethyl trisiloxane.

In FIG. 1, TTSM 10 has, as the fillers, metal or solder alloy particles 14, which are highly thermally conductive and have a very high thermal capacitance per unit volume. Solder alloy particles 14 may be readily formulated to provide a suitable range of melt (phase change) temperatures. While thermal conditions will vary depending on the particular application, solder alloys with a melting temperature (MP) or a solidus and/or liquidus temperature within a range of about 85° C. to about 200° C. may be appropriate for transient thermal events of many power-generating electronic devices. For this reason, suitable solder alloys for use with this invention include those composed of indium (In), tin (Sn), bismuth (Bi), lead (Pb), zinc (Zn), cadmium (Cd), copper (Cu), silver (Ag) and/or gold (Au), as well as any other metal or nonmetal that may be alloyed in a solder/metal. A size for solder particles 14 should be less than 0.1 cm, with a suitable range being about 4.5 to about 10 micrometers. The suitable size range is intended to ensure that particles 14 will at least partially melt during a transient thermal event.

Since metal alloys are electrically conductive, particles 14, as shown in FIG. 2, are provided with dielectric coating 16 to ensure that TTSM 10 is not electrically conductive. A suitable material for coating 16 may be a polymer, such as an amorphous polyetherimide thermoplastic resin commercially available from General Electric under the name ULTEM.RTM., polypropylene oxide (PPO), an acrylate commercially available from DuPont under the name ELVACITE.RTM., and other high electrical resistivity materials that can withstand the expansion of solder particle 14 when it melts. Coating 16 may be applied to solid solder particles 14 prior to mixing particles 14 into matrix material 12 containing the thinner. This is to ensure that solder particles 14 will be completely coated with coating 16 so as not to provide an electrical conduction path through TTSM 10. For this purpose, coating 16 may be applied in a range of about 0.5 to 6% by weight of each of particles 14 to yield a suitable coating thickness.

Figure 3:
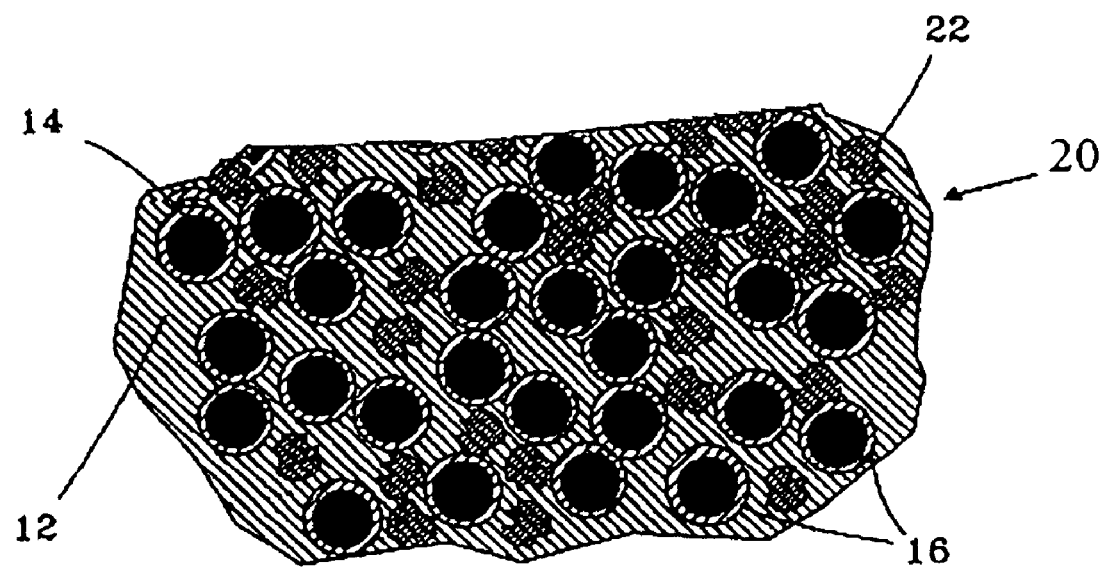
FIG. 3 is a cured TTSM according to another embodiment of the present invention.

In FIG. 3, TTSM 20 represents another embodiment of the cured TTSM the present invention. TTSM 20 is formulated for more demanding applications that require faster transfer of transient heat energy from an electrical component. TTSM 20 comprises the same matrix material 12 and solder alloy particles 14 with coating 16 as above-described. In addition, TTSM 20 contains particles 22 of a thermally-conductive but dielectric material. Suitable materials for the dielectric particles 22 are those that are more thermally conductive than matrix material 12, and therefore serve as a filler that raises the coefficient of heat transfer of TTSM 20. Certain ceramic materials are particularly suitable for this purpose. Examples of suitable materials for forming particles 22 include alumina ($Al_2O_3$), boron nitride (BN), aluminum nitride (AlN), silicon carbide (SiC) and silicon nitride ($Si_3N_4$), though it is foreseeable that other non-electrically conductive materials with thermal conductivities of higher than that of matrix material 12 could be used. A suitable size for dielectric particles 22 is about 0.5 to about 200 micrometers, with a range of about 0.45 to 10 micrometers being particularly suited for the purpose of achieving a suitable thermal conductivity for the cured TTSM 20. TTSM 20 may contain up to 97 weight % coated particles 14 (particles 14 and coating 16 combined) and about 0 to about 25 weight % dielectric particles 22, with the balance being the matrix material 12.

It is to be understood that thermal transfer through TTSM 10 and 20 of this invention can be further improved with the addition of smaller thermally-conductive but dielectric particles (not shown) to coating 16 surrounding the solder alloy particles 14. These dielectric coating particles may be added to the material for coating 16 prior to particles 14 being coated. The same materials discussed above for the particles 22 can be used for the dielectric coating particles. The dielectric coating particles may be sized to be adhered to solder particles 14 with coating 16. For this reason, a suitable size range for the particles is about 0.5 to about 200 micrometers, with a size of about 0.45 to about 10 micrometers being particularly suited for this application, which is roughly the thickness of coating 16. The dielectric coating particles may be used in amounts of about 50 to about 90 weight % of coating 16.

Figure 4:
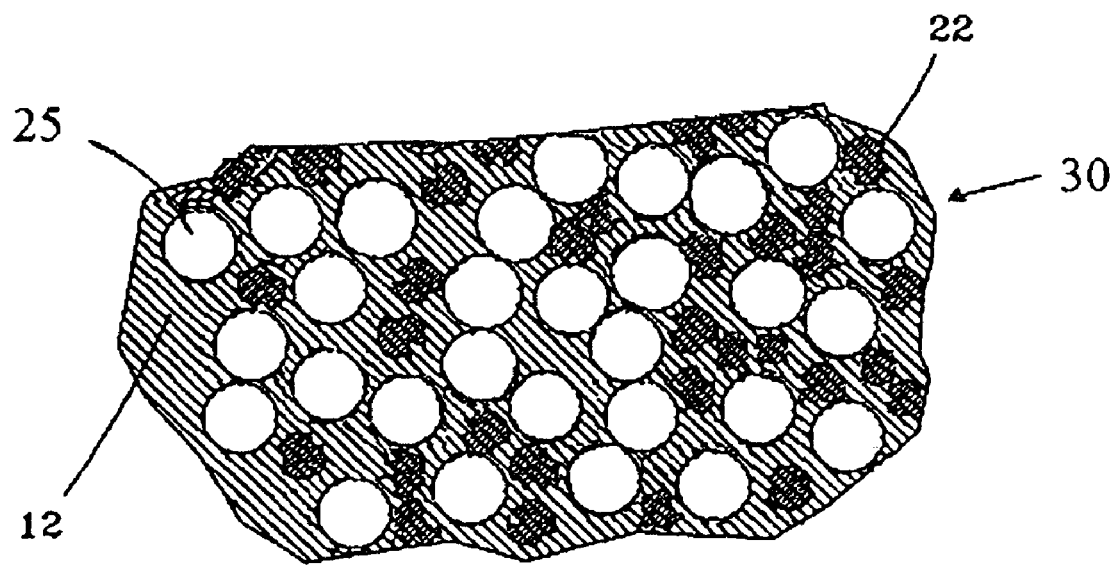
FIG. 4 is a cured TTSM according to an alternative embodiment of the present invention.

In FIG. 4, TTSM 30 represents an alternative embodiment of a cured TTSM of the present invention. TTSM 30 may be made by the method of the present invention or the method described in U.S. Pat. No. 6,703,128 and US patent application No. 20030158294. As shown, TTSM 30 comprises matrix material 12, non-metallic organic particles 25 and dielectric particles 22. Organic particles 25 are used, in place of the metallic or solder material, as the phase-change material for absorbing the transient thermal energy. Suitable materials for producing organic particles 25 may include a polypropylene derivative or a synthetic wax, such as Honeywell A-CX 1514 having a melting point of 153° C. Other synthetic waxes produced by Honeywell (Honeywell International Inc., 101 Columbia Road, Morristown, N.J. 07962) or other manufacturer may also be used. The synthetic waxes have varying ranges of operating temperatures, particularly useful for use in various electronic applications. Usually, transient heat energy absorption occurs at a temperature range between 50° C. to 200° C. The suitable size range of 4.5 to about 100 micrometers of organic particles 25 should ensure that particles 25 will at least partially melt during a transient thermal event.

The use of the non-electrically conductive organic materials eliminates the need for the phase change particle coating process, reduces the density of the final material, and reduces constituent material costs. Although the use of non-metallic phase change materials may reduce the performance of the final TTSM, the performance of this TTSM material is still suitable for some applications and reduces the cost of the potting material. This new lower cost material is particularly useful for applications that generate thermal transients that are lower in power and longer in duration.

Although FIG. 4 shows TTSM 30 that also contains dielectric particles 22, it is to be understood that the addition of particles 22 may be optional. TTSM 30 may contain only matrix material 12 and non-metallic organic particles 25. It is also to be understood that if a thinner is used to reduce the viscosity of the matrix material during the mixing process, it is possible to produce the final TTSM that has up to 80 weight % of the non-metallic organic wax particles 25. However, if the thinner is not used, the content of the non-metallic organic wax particles in the final product may reach about 60 weight % of the total TTSM weight.

It is contemplated that TTSM 10, 20, 30 or any variation thereof may be used as a potting material to seal an electronic power device mounted on a circuit board or other substrate. The material also may be used as a filler in contact with a heat sink of an electronic module for allowing for faster energy transfer from the power device. The heat is transferred into a large volume of phase change material in TTSM, increasing the amount of thermal energy that can be quickly absorbed after being conducted from the power device.

The following examples 1-4 describe results of the thermal performance test of TTSM of the present invention. The TTSM has been prepared from the starting materials listed in Table 1.

TABLE 1

| Solder Alloy | 70Sn/18Pb/12In |
|---|---|
| Solder Powder Size | 100-160 um (3.9-6.3 mils) Spherical (Runner/Lead Spacing > 3 Powder Diameters) |
| Solder Coating | PPO (Polyphenylene oxide), Light Coat: 0.03 by Weight (0.1 by Volume), Heavy Coat: 1.8% by Weight (8.1% by Volume) |
| Matrix Material | Two Part Silicone-Dow Corning 3-4207, Tough Gel |
| Matrix Boron Nitride | PT350, Size 100-150 um (3.9-5.9 mils) |
| Coating Boron Nitride | PT180, Size 5-11 um (0.2-0.4 mils) |
| Silicone Thinner | Dow Corning OS-20 (Octamethyl trisiloxane) |

EXAMPLE 1

Effect of the Addition of OS-20 on Pour Thickness of TTSM

Figure 5:
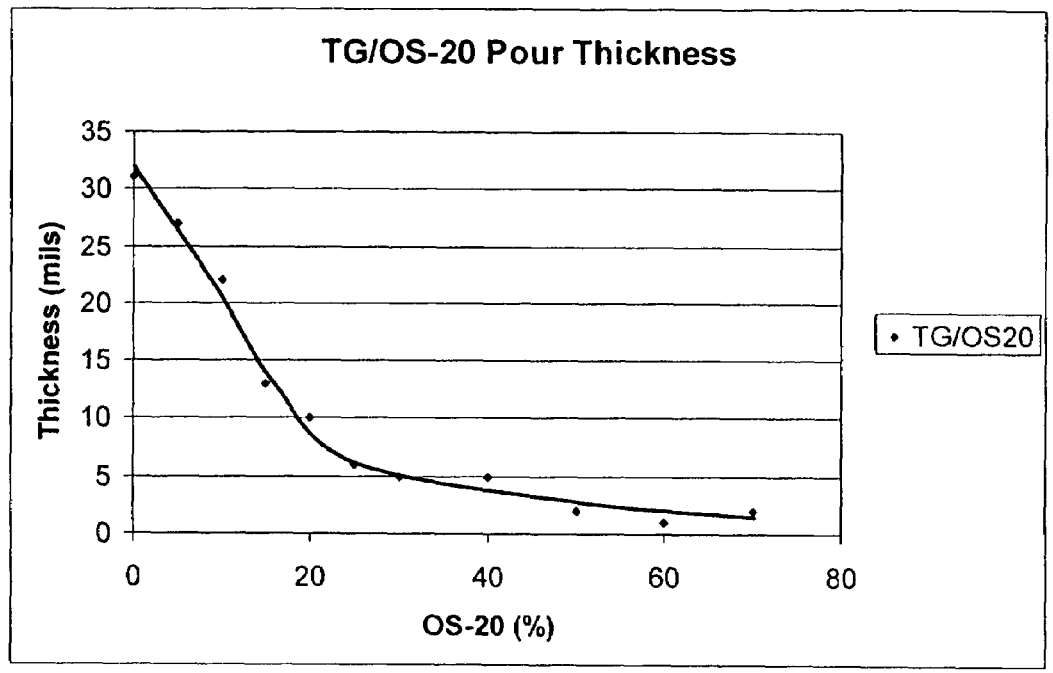
FIG. 5 is a graph showing the effect of a thinner on the pour thickness of a TTSM of the present invention.

Experiments were performed by mixing different amounts of OS-20 to different batches of the matrix material (tough gel, TG) to reduce the viscosity of the matrix material. After the mixing was complete, the liquid gels were poured onto a substrate to solidify, and cure. The curing process took up to 4 to 6 hours if more OS-20 was added. At the end of the curing process, the thickness of the cured matrix material was measured. The measurement results are presented in FIG. 5. As shown, the more OS-20 was added to the matrix material, the thinner the cured final material was formed. Up to 70 weight % of OS-20 could be added to maintain an acceptable pour thickness of about 0.05 mm (0.002 in) or less.

EXAMPLE 2

Effect of Thickness of TTSM on Thermal Transient Performance

Figure 6:
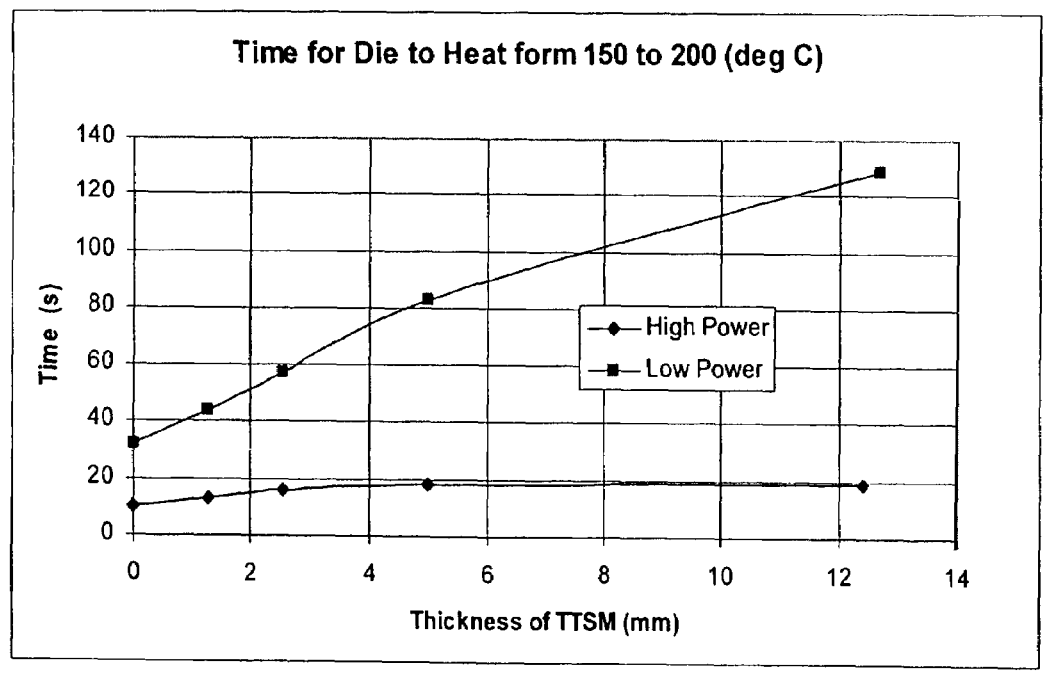
FIG. 6 is a graph showing the effect of thickness of TTSM on heat absorption characteristics measured in term of the time required for the temperature to rise from 150° C. to 200° C..

As shown in FIG. 6, TTSM prepared according to the process of the present invention was tested with two levels of power devices: low power (Steady State 12 W, Transient 36

W) and high power (Steady State 20 W and Transient 60 W). The results indicate that with the lower power, the thickness of TTSM had very little effect on the time required for the temperature of a die junction to change from 150° C. to 200° C. A thickness of 0.002 inch or 0.05 mm appeared to be optimal. With the high power, it appeared that the time required for the temperature of a die junction to change from 150° C. to 200° C. depended on the thickness of TTSM. The thicker the TTSM, the more the heat energy was absorbed, resulting in the longer time for the temperature to change to 200° C.

EXAMPLE 3

Thermal Properties of Two Formulations of TTSM

Two formulations of TTSM-1 and TTSM-2 were prepared according to the method of the present invention. TTSM-1 contained 6 weight % of the matrix material (TG), 13 weight % of boron nitride particles, and 81% of coated solder particles (6TG/13BN/81 Solder). TTSM-1 had solder particles having light coating (see Table 1). TTSM-2 had 4 weight % of the matrix material, 7 weight % of boron nitride particles, and 89% of coated solder particles (4TG/7BN/89 Solder). TTSM-2 had solder particles having heavy coating (see Table 1). TTSM-1 and TTSM-2 were tested with two power levels, a high power and a low power. The transient performance of TTSM-1 and TTSM-2 was determined and the results are reported in Table 2. The transient performance numbers represent the time required in seconds for the die junction temperature to rise from 150° C. to 200° C. The numbers in parentheses are the ratio of the observed times with TTSM material/without TTSM material.

TABLE 2

| Test | TTSM-1 (6TG/13BN/81Solder) | TTSM-2 (4TG/7BN/89Solder) |
|---|---|---|
| Conductivity (K) (w/mK) | 3.21 | 1.76 |
| Heat Capacitance (J/g) | 33.1 | 33.8 |
| Electrical Resistance ($10^{13}$ ohms) | 1.5 | 2.8 |
| Voltage Break Down (V) | 2261 | 3560 |
| Transient Performance | | |
| Lo Power (sec) | 36.5 (1.99X) | 36.8 (1.97X) |
| Hi Power (sec) | 16.6 (1.69X) | 17.3 (1.76X) |

EXAMPLE 5

Thermal Property of TTSM Containing A-CX 1514 Particles

Three formulations of TTSM was prepared by mixing varying amounts of A-CX 1514 particles and BN particles with the matrix material (TG). The materials were tested with two power levels, the low power and the high power, as above-described. The final content of the formulations are indicated in Table 3. The thermal properties of each formulations are also reported in Table 3. The transient performance numbers represent the time required in seconds for the die junction temperature to go from 150° C. to 200° C. The numbers in parentheses are the ratio of times required for the change from 150° C. to 200° C.—with TTSM material/without TTSM material.

TABLE 3

| | Mix Ratios (TG/BN/A-CX 1514) | | |
|---|---|---|---|
| Test | 18/41/41 | 31/23/46 | 34/26/40 |
| Conductivity (K) (w/mK) | 0.63 | 0.40 | 0.56 |
| Heat Capacitance (J/g) | 26.4 | 21.7 | 29.6 |
| Electrical Resistance ($10^{13}$ ohms) | 4.8 | 1.3 | 1.7 |
| Voltage Break Down (V) | 6300 | 6750 | 6800 |
| Transient Performance | | | |
| Lo PWR (sec) | — | — | 33.5 (1.77X) |
| Hi PWR (sec) | — | — | 15.6 (1.35X) |

While the present invention has been described as having exemplary embodiments, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A polymer-base material for encapsulating an electronic module comprising
   a silicone polymer matrix material; and
   filler particles dispersed in the matrix material, wherein the filler particles include organic wax particles and dielectric particles, and wherein a ratio of polymer matrix material to organic wax to dielectric particles is 34:26:40.

2. The polymer-base material of claim 1, wherein the organic wax particles are made of a polypropylene compound.

3. A method for producing a thermal transient suppression material on a heat generating electronic module comprising:
   mixing a curable silicone compound and a suitable thinner to form a thinned matrix-forming material;
   combining a filler to the thinned matrix-forming material to form a mixture, said filler being selected form the group consisting of dielectrically coated solder alloy particles and wax particles;
   applying the mixture onto the heat generating electronic module; and
   evaporating the thinner from the coating, and curing the curable compound to form a thermal transient suppression material, said a thermal transient suppression material composed of the filler dispersed in a cured matrix material.

4. A method as claimed in claim 3, wherein the suitable thinner comprises Octamethyl trisiloxane, tetradecamethyl hexasloxane and hexamethyl disiloxane.

5. A method as claimed in claim 3, wherein the mixture comprises up to 80 weight percent of the thinned matrix-forming material.

6. A method as claimed in claim 3, further comprising, prior applying the mixture onto the hear generating electronic module, adding a dielectric filler, wherein the dielectric filler is a ceramic material.

7. A method as claimed in claim 6, wherein the dielectric filler is alumina, boron nitride, silicon carbide, silicon nitride or a combination thereof.

8. A method as claimed in claim 3, wherein said thermal transient suppression material comprises more than 80 weight percent of said filler.

9. A method as claimed in claim 3, wherein said thermal transient suppression material has a thickness of about 0.05 mm or less.

10. A method as claimed in claim 3, wherein the filler comprises synthetic wax particles.

11. A method as in claim 10, wherein the wax particles are made of a polypropylene compound.

12. A method as in claim 10, wherein the thermal transient suppression material comprises about 60 to about 80 weight percent wax particles.

* * * * *